United States Patent
Takahashi et al.

[11] Patent Number: 6,041,995
[45] Date of Patent: Mar. 28, 2000

[54] WIRE BONDING METHOD

[75] Inventors: Kuniyuki Takahashi; Tatsunari Mii, both of Musashimurayama, Japan

[73] Assignee: Kabushiki Kaisha Shinkawa, Tokyo, Japan

[21] Appl. No.: 09/035,530

[22] Filed: Mar. 5, 1998

[30] Foreign Application Priority Data

Mar. 6, 1997 [JP] Japan ..................................... 9-069287

[51] Int. Cl.[7] ................................................. H01L 21/00
[52] U.S. Cl. ..................... 228/164; 228/141.1; 228/178; 228/4.5; 228/5.1; 228/180.5
[58] Field of Search ................................. 228/164, 141.1, 228/178, 4.5, 5.1, 180.5

[56] References Cited

U.S. PATENT DOCUMENTS

| 4,482,794 | 11/1984 | Kurtz et al. ........................... | 219/56.22 |
| 5,176,310 | 1/1993 | Akiyama et al. ....................... | 228/179 |
| 5,871,141 | 2/1999 | Hadar et al. ........................... | 228/180.5 |

FOREIGN PATENT DOCUMENTS

| S57-87143 | 5/1982 | Japan . |
| S63-77131 | 4/1988 | Japan . |
| S64-17433 | 1/1989 | Japan . |
| H1-42349 U | 12/1989 | Japan . |
| H3-780 | 1/1991 | Japan . |

*Primary Examiner*—Patrick Ryan
*Assistant Examiner*—M. Alexandra Elve
*Attorney, Agent, or Firm*—Koda & Androlia

[57] ABSTRACT

In a wire bonding method, particularly a method for forming a ball at an end of a bonding wire that has an intended ball size, a tail length of the bonding wire extending from the lower end of a capillary is determined according to the size of the intended ball and the internal shape of the lower end portion of the capillary, and the wire end having such a tail length is melted up to the lower end surface of the capillary by a discharge produced by an electric torch so as to form a ball on the wire end.

6 Claims, 2 Drawing Sheets

WIRE BONDING METHOD

BACKGROUND OF THE INVENTION

1. Field of the Invention

The present invention relates to a wire bonding method, and more particularly to a method for forming a ball at the end of a bonding wire.

2. Prior Art

Various wire bonding methods have been proposed, and FIG. 3 illustrates one of the currently most commonly used methods.

In FIG. 3, first, in step (a), a ball 3a is formed on a wire 3 extending from the lower end of a capillary 4 by means of a spark discharge produced by an electric torch 5 while a clamper 6 is in a closed state to hold the wire 3. Afterward, the electric torch 5 is withdrawn in the direction of arrow T; and at the same time, the damper 6 is opened. When the damper 6 is opened, the wire 3 is raised by the back tension which has been applied to the wire 3, and the ball 3a is pressed against the chamfer (not shown) which is formed at the lower end of the capillary 4.

Next, in step (b), the capillary 4 is moved horizontally to a position above the first bonding point 1a. Then, in step (c), the capillary 4 is lowered so that the ball 3a on the tip end of the wire 3 is pressed against the first bonding point 1a; and an ultrasonic vibration is applied to the capillary 4 by a horn (not shown) on which the capillary 4 is provided. The ball 3a is thus bonded to the first bonding point 1a.

Subsequently, in step (d), the capillary 4 is raised, and in step (e), the capillary 4 is moved to a position above the second bonding point 2a. Next, in step (f), the capillary 4 is lowered so that the wire 3 is pressed against the second bonding point 2a, and an ultrasonic vibration is applied to the capillary 4 by the horn, thus bonding the wire 3 to the second bonding point 2a. Afterward, the capillary 4 is raised to a predetermined position, and the damper 6 is closed; and then the capillary 4 and damper 6 are both raised together so that the wire 3 is cut in step (g). When the wire 3 is thus cut, a tail length L required for forming the next ball remains extending from the lower end of the capillary 4.

The bonding method as described above is disclosed in, for instance, Japanese Pre-Examination Patent Publication (Kokai) Nos. S57-87143, S63-77131 and S64-17433. Furthermore, the capillaries referred to above are disclosed in, for instance, Japanese Examined Utility Model Publication (Kokoku) No. H1-42349 and Japanese Examined Patent Publication (Kokoku) No. H3-780.

In the prior art described above, the tail length L is longer than the length that is actually required for forming the ball 3a, and the size of the ball 3a is controlled by means of the output value and output time of the discharge current or discharge voltage. However, in the prior art method, especially when a small ball 3a is to be formed, it is necessary to reduce the discharge current or lower the discharge voltage so as to form the ball 3a in a shorter time. As a result, the discharge tends to be unstable due to external factors (including temperature and the gap between the electric torch 5 and tip end of the wire 3). Furthermore, an operation is required to open the damper 6 so that the damper 6 pulls up the wire 3 by way of back tension after the ball formation in order to prevent the center deviation of the ball 3a.

SUMMARY OF THE INVENTION

Accordingly, the object of the present invention is to provide a wire bonding method which makes it possible to obtain a desired ball size using a discharge current or discharge voltage and output time necessary for a stable discharge and which requires no countermeasures against center deviation.

The above object of the present invention is accomplished by a unique wire bonding method that connects a first bonding point and a second bonding point by a wire, wherein the tail length of a wire extending from a lower end of a capillary is determined based upon a ball size and an internal shape of the lower end portion of the capillary, and the tail length is melted up to the lower end surface of the capillary by a discharge produced by an electric torch so as to form a ball on the wire.

DETAILED DESCRIPTION OF THE INVENTION

Figure 1:
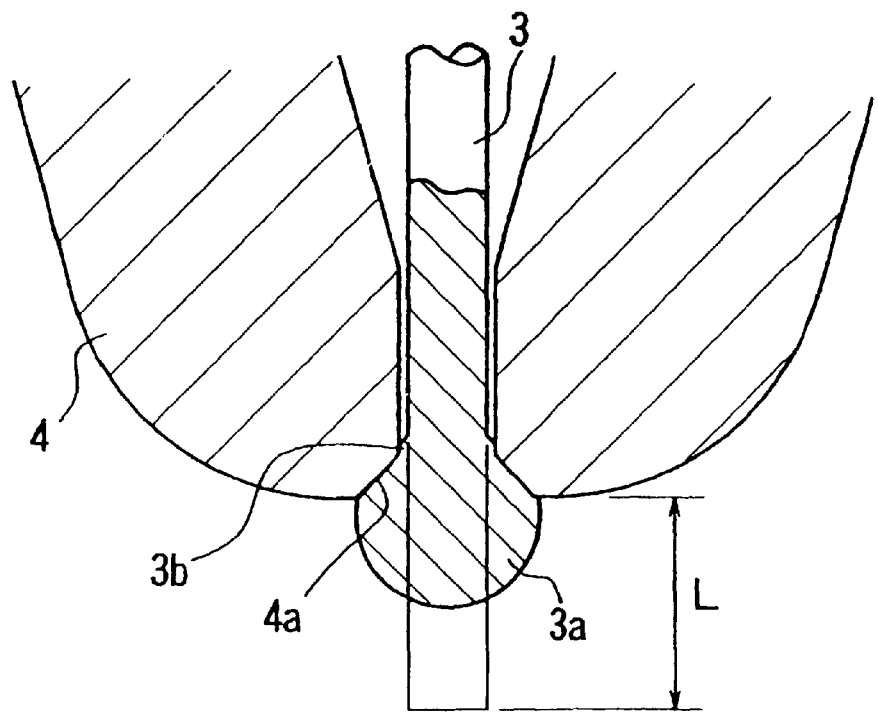
FIG. 1 is a sectional view of the lower end of a capillary employed in one embodiment of the wire bonding method of the present invention.
Figure 3:
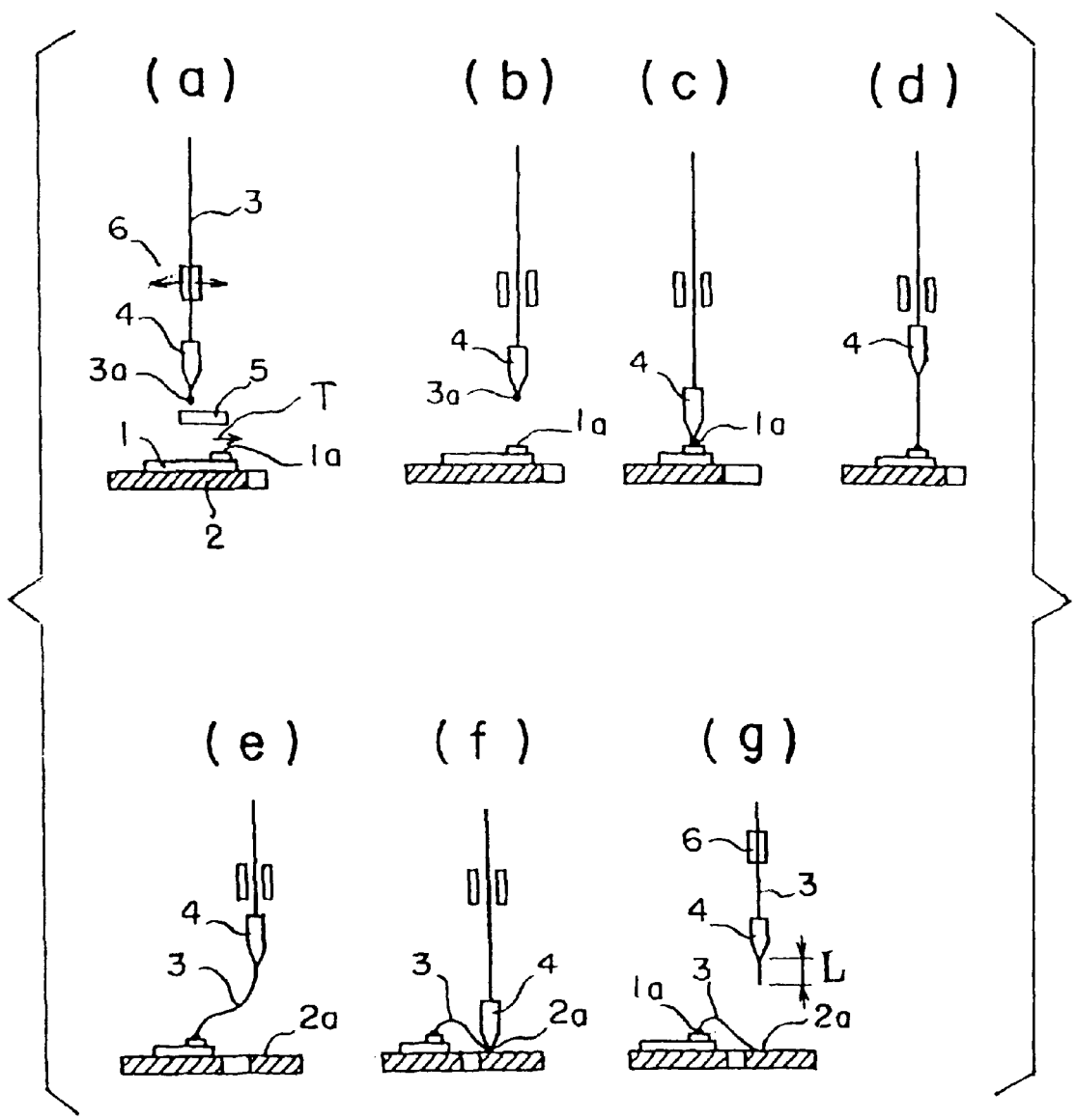
FIG. 3 shows the steps of a wire bonding method.

One embodiment of the present invention will be described with reference to FIG. 1 with an additional reference being made to FIG. 3. In addition, the constituting elements which are the same as in FIG. 3 or which correspond to the elements in FIG. 3 will be described using the same reference numbers.

In the present invention, when a ball 3a is formed at the end of a bonding wire 3, a discharge is performed using a sufficient discharge current or discharge voltage output value and a sufficient discharge time so that the tail length L is sufficiently melted. As a result of this discharge, the tail length L is sufficiently melted; and when a portion of the ball 3a being melted enters the interior of the chamfer 4a of the capillary 4, the melting of the wire 3 is stopped so that the ball 3a is prevented from becoming any larger.

Since the tail length L is sufficiently melted, it is necessary that the tail length L be determined by the size of the ball 3a that is to be formed and the internal shape of the chamfer 4a of the capillary 4, etc. Accordingly, for the type of particular capillary 4 to be used, the relationship between the size of the ball 3a and the tail length L is analyzed beforehand by experiment or by means of a geometrical formula; and then the tail length L formed in the step (g) shown in FIG. 3 is controlled according to the capillary 4 used and the size of the ball 3a that is to be formed.

Next, the method used to analyze the tail length L by means of a geometrical formula of the capillary 5 will be described with reference to FIG. 2. The portion 3b of the melted wire 3 that is pushed up into the capillary as shown in FIG. 1 is extremely small; therefore, it can be ignored.

Figure 2:
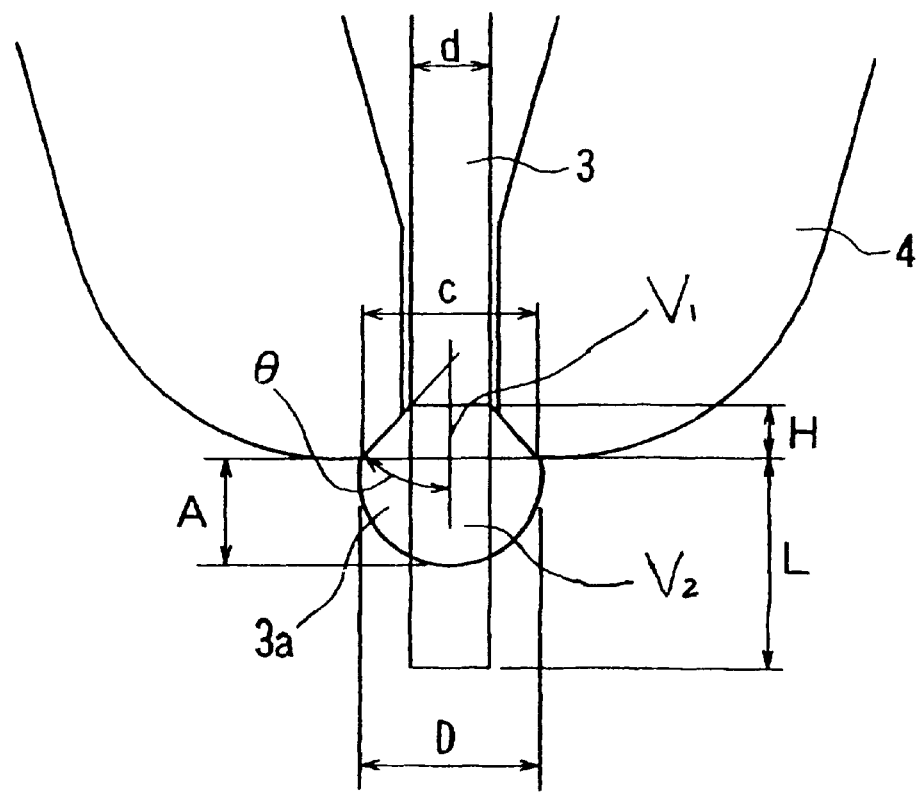
FIG. 2 is an explanatory diagram which is used for analysis of the tail length.

In FIG. 2, d is a wire diameter, C is a chamfer diameter, D is a ball diameter, A is a ball thickness, L represents the tail length, and θ is the chamfer angle. In addition, $V_1$ is a volume of the ball inside the capillary 4, and $V_2$ is a volume of the ball beneath the capillary 4. Furthermore, H is the measured length from the bottom plane to the top plane of the volume $V_1$.

Since the volume obtained by adding $V_1$ and $V_2$ is equal to the volume of the wire of length (L+H), the relationship shown in Equation 1 holds true. Since the volume $V_1$ has the shape of a truncated cone, the relationship shown in Equation 2 also holds true. Furthermore, since the volume $V_2$ has a shape of a spherical fragment that is obtained by cutting the upper portion of a sphere, which has a diameter D, by a diameter C, the relationship shown in Equation 3 holds true. In addition, the length H can be expressed as shown in Equation 4.

$$V_1+V_2=(\pi/4) \cdot d^2 \cdot (L+H) \quad \text{[Equation 1]}$$

$$V_1=(\pi/24) \cdot \tan(90°-\theta) \cdot (C^3-d^3) \quad \text{[Equation 2]}$$

$$V_2=(\pi/6) \cdot A^2 \cdot (3D-2A) \quad \text{[Equation 3]}$$

$$H=\{(C-d)/2\} \cdot \tan(90°\theta) \quad \text{[Equation 4]}$$

If the tail length L is determined by substituting Equations 2, 3 and 4 into Equation 1 and making the necessary rearrangements, then the result obtained is as shown in Equation 5. In Equation 5, θ and C are known values based on the capillary 4, and the wire diameter d is also a known value.

As an example, assuming that θ=45°, C=52 μm and d=30 μm, then the tail length L can be expressed by Equation 6. Accordingly, assuming that a ball with a ball diameter D of 54 μm and a ball thickness A of 32 μm is to be obtained, then the tail length L=84.4 μm. Furthermore, it goes without saying that if the shape of the interior of the capillary 4 changes, then the numerical formula used to determine the tail length L also changes.

$$L=(1/6\ d^2)\{C^3 \cdot \tan(90°-\theta)+12A^2 \cdot D-8A^3-3d^2C \cdot \tan(90°-\theta)+2d^3 \cdot \tan(90°-\theta)\} \quad \text{[Equation 5]}$$

$$L=(1/5400) \cdot (54208+12A^2D \cdot 8A^3) \quad \text{[Equation 6]}$$

The above analysis is made with an assumption that the structural density of the wire 3 itself is the same as the structural density of the ball 3a. However, since the structural densities of these two (the wire and the ball) are actually different, it is necessary to apply a fixed coefficient to Equation 5.

In the above embodiment, the size of the ball 3a is determined by the tail length L; accordingly, the ball 3a can be formed using the output value and output time of the discharge current or discharge voltage required for a stable discharge, and the ball 3a is unaffected by external factors. Accordingly, this method is especially effective in the formation of small balls. Furthermore, since the ball 3a enters the interior of the chamfer 4a, there is no need for providing countermeasures against center deviation of the ball 3a.

As described above, in the present invention, the tail length of the wire extending from the lower end of the capillary is determined based upon the ball size and the internal shape of the lower end portion of the capillary, and the tail length is melted up to the lower end surface of the capillary by means of a discharge produced by an electric torch to form a ball. Accordingly, a desirable ball size can be obtained using the discharge current or discharge voltage and output time for a stable discharge; and in addition, there is no need for any countermeasures against the center deviation of the ball.

What is claimed is:

1. A wire bonding method for connecting a first bonding point and a second bonding point by a wire, wherein a tail length of said wire extending from a lower end of a capillary is determined based upon a predetermined ball size and an internal shape of a lower end portion of said capillary, and said tail length is melted up to a lower end surface of said capillary by means of a discharge produced by an electric torch to form a ball of said predetermined ball size on said wire in said lower end portion of said capillary.

2. The wire bonding method according to claim 1, wherein said internal shape of a lower end portion of said capillary is a chamfer.

3. The wire bonding method according to claim 2, wherein said chamfer has an angle of 45°.

4. The wire bonding method according to claim 3, wherein a chamfer diameter is 52 μm and a wire diameter is 30 μm.

5. The wire bonding method according to claim 2, wherein said tail length is determined by the formula as follows:

$$L=(1/6d^2)\{C^3 \cdot \tan(90°-\theta)+12A^2 \cdot D-8A^3-3d^2 \cdot C \cdot \tan(90°-\theta)+2d^3 \cdot \tan(90°-\theta)\}$$

wherein L=tail length, C=chamfer diameter, D=ball diameter, A=ball thickness, θ=chamfer angle and d=wire diameter.

6. The wire bonding method according to claim 4, wherein said tail length is determined by the formula as follows:

$$L=(1/5400) \cdot (54208+12A^2 \cdot D-8A^3)$$

wherein L=tail length, A=ball thickness and D=ball diameter.

\* \* \* \* \*